(12) United States Patent
Singh et al.

(10) Patent No.: US 8,378,727 B2
(45) Date of Patent: Feb. 19, 2013

(54) BISTABLE CML CIRCUIT

(75) Inventors: Pratap Narayan Singh, Varanasi (IN); Stéphane Le Tual, Saint Egreve (FR)

(73) Assignee: STMicroelectronics SA, Montrouge (FR)

( * ) Notice: Subject to any disclaimer, the term of this patent is extended or adjusted under 35 U.S.C. 154(b) by 54 days.

(21) Appl. No.: 13/166,608

(22) Filed: Jun. 22, 2011

(65) Prior Publication Data

US 2011/0316587 A1  Dec. 29, 2011

(30) Foreign Application Priority Data

Jun. 25, 2010 (FR) ...................................... 10 55092

(51) Int. Cl.
*H03K 3/00* (2006.01)
(52) U.S. Cl. .......................................... 327/199; 327/64
(58) Field of Classification Search .............. 327/63–65, 327/199, 208, 210, 214, 215, 225
See application file for complete search history.

(56) References Cited

U.S. PATENT DOCUMENTS

| | | | |
|---|---|---|---|
| 4,893,274 A | 1/1990 | Fukushi | |
| 5,510,734 A | 4/1996 | Sone | |
| 5,699,002 A | 12/1997 | Hayakawa | |
| 7,336,114 B2 | 2/2008 | Razavi et al. | |
| 2009/0021283 A1 | 1/2009 | Payne et al. | |

FOREIGN PATENT DOCUMENTS

| | | |
|---|---|---|
| EP | 0 688 100 A2 | 12/1995 |
| WO | WO 2009/012373 A1 | 1/2009 |

OTHER PUBLICATIONS

République Française Institut National de la Propriété Industrielle, Rapport de Recherche Préliminaire (Preliminary Search Report); issued in French Patent Application No. FR 1055092 on Dec. 16, 2010 (2 pages).

*Primary Examiner* — Lincoln Donovan
*Assistant Examiner* — William Hernandez
(74) *Attorney, Agent, or Firm* — Slater & Matsil, L.L.P.

(57) ABSTRACT

A common-source circuit including two branches in parallel between a terminal of application of a voltage and a current source, each branch comprising: a series association of a resistor and a transistor, having their junction point defining an output terminal of the branch; a first switch connecting an input terminal of the branch to a control terminal of the transistor; and a controllable stage for amplifying data representing the level present on the output terminal of the opposite branch.

20 Claims, 4 Drawing Sheets

BISTABLE CML CIRCUIT

This application claims the benefit of French patent application Ser. No. 10/55092, filed on Jun. 25, 2010, entitled "Bistable CML Circuit," which application is incorporated herein by reference.

TECHNICAL FIELD

The present invention generally relates to latch-type storage elements developed for the so-called Current Mode Logic (CML). The present invention relates to such storage elements whatever the circuit in which they are embarked, for example, electronic circuits comprising other functions such as a digital-to-analog converter or a frequency division system.

BACKGROUND

A latch is a storage element comprising two phases: a transparent phase during which the input values are copied onto the output and a storage phase during which the output state is maintained whatever the input state.

Generally, a storage element of CML latch type is formed of several branches, each branch comprising a charge component connected to an output terminal. The output terminal is connected to a current source common to the branches. Complementary logic input signals are applied to the control terminals of switches arranged in each branch.

A latch capable of operating under a power supply voltage smaller than that commonly used for the technology in which the circuit is manufactured has already been provided. An example of such a latch is described in U.S. Pat. No. 7,336,114. A disadvantage of the known latch is the presence, in each branch, of three transistors in series. The corresponding cumulated voltage drops adversely affect the power supply voltage decrease. It would be desirable to overcome the above shortcoming and further to accelerate the switching of a CML latch.

SUMMARY OF THE INVENTION

An embodiment of the present invention provides a common-source circuit comprising two branches in parallel between a terminal of application of a voltage and a current source, each branch comprising: a series association of a resistor and of a transistor, having their junction point defining an output terminal of the branch; a first switch connecting an input terminal of the branch to a control terminal of the transistor; and a controllable stage for amplifying data representing the level present on the output terminal of the opposite branch.

According to an embodiment of the present invention, each controllable stage comprises a second switch between the control terminal of the transistor and the output terminal of the opposite branch.

According to an embodiment of the present invention, each controllable stage comprises a second switch between the control terminal of the transistor and a buffer amplifier, an input terminal of this buffer amplifier being connected to the output terminal of the opposite branch.

According to an embodiment of the present invention, each controllable stage comprises a second switch between the control terminal of the transistor and an inverter, an input terminal of this inverter being connected to the output terminal of the concerned branch.

According to an embodiment of the present invention, each controllable stage comprises a second switch between the control terminal of the transistor and a differential amplifier, the input terminals of this differential amplifier being connected to each of the output terminals, the output terminals of this differential amplifier being connected to the respective terminals of the second switches.

According to an embodiment of the present invention, the first and second switches form means for avoiding a simultaneous conduction of the two branches.

According to an embodiment of the present invention, the transistors are MOS transistors.

According to an embodiment of the present invention, the transistors are bipolar transistors.

The present invention also provides a method for controlling a common-source logic circuit, wherein: in a first phase, the first switches are on and the second switches are off; and in a second phase, the first switches are off and the second switches are on.

BRIEF DESCRIPTION OF THE DRAWINGS

The foregoing and other objects, features, and advantages of the present invention will be discussed in detail in the following non-limiting description of specific embodiments in connection with the accompanying drawings.

DETAILED DESCRIPTION OF ILLUSTRATIVE EMBODIMENTS

Figure 1:
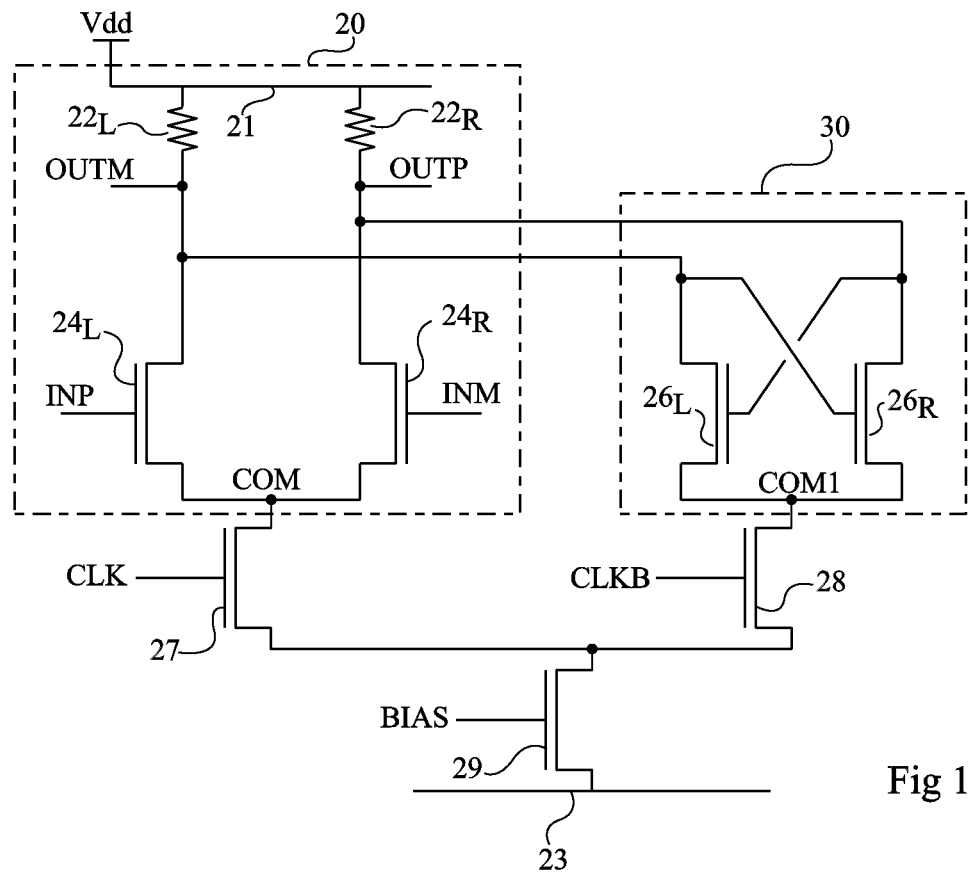
FIG. 1 shows a detailed electric diagram of a known CML latch.

For clarity, the same elements have been designated with the same reference numerals in the different drawings.

The present invention will be described in relation with transistors in CMOS technology. The present invention can however be applied to any other transistor technology or to a combination of different technologies.

FIG. 1 shows the diagram of a latch such as described in U.S. Pat. No. 7,336,114, the relevant teaching of which is incorporated herein by reference. This latch comprises two sub-assemblies: an amplification stage 20 and a storage stage or bistable (latch) 30.

Amplification stage 20 comprises, in parallel between a terminal 21 of application of a power supply voltage Vdd (the high logic level) and a node COM, two branches, each comprising two series-assembled components: a charge resistor 22 ($22_L$, $22_R$) and a transistor 24 ($24_L$, $24_R$) of an input stage. Output terminals OUTP and OUTM are defined by the junction points of the series assemblies. Input terminals INP and INM are connected to the control terminals of transistors 24. The conduction terminal (source or drain) of each transistor 24, opposite to resistor 22, is connected to node COM. Node COM is connected to a conduction terminal of a transistor 27 used as a switch or as a current switcher. A clock signal CLK is applied to the control terminal of this switch.

Bistable 30 comprises two transistors 26 ($26_L$, $26_R$). The drain of one of transistors 26 is connected to the junction point of one of the series assemblies of stage 20. The drain of the other transistor 26 is connected to the junction point of the other series assembly of stage 20. The control terminal of each transistor 26 is connected to the drain of the other transistor 26.

The source of each transistor 26 is connected to a node COM1. Node COM1 is connected to a conduction terminal of a transistor 28 used as a switch or as a current switcher. A clock signal CLKB, complementary to signal CLK, is applied to the control terminal of this switch. The conduction terminals of transistors 27 and 28, opposite to nodes COM and COM1, are connected to a current source 29 (for example, a MOS transistor). A control signal BIAS is applied to the control terminal of this current source. The other terminal of this current source is connected to ground 23.

The CML latch of FIG. 1 converts a voltage difference between its inputs INP and INM into logic levels. This latch has two operating phases: a transparent phase and a storage phase. For simplification, logic input signals are considered.

The transparent phase enables amplifying the difference between the voltage levels applied on input terminals INP and INM towards output terminals OUTP and OUTM.

The case of a signal CLK of high logic level is for example considered; signal CLKB then is at the complementary low logic level. Transistor 27 is on and transistor 28 is off. It is assumed that a high logic level is applied to input terminal INP and that a low logic level is applied to input terminal INM. Current source 29 is also assumed to be conductive.

Transistor $24_R$ is off and transistor $24_L$ is on. Current source 29, through transistors 27 and $24_L$, draws output terminal OUTM to the low logic state. Conversely, output terminal OUTP remains in the high logic state, transistor $24_R$ being off. Bistable 30 is inactive, transistor 28 being off.

The storage phase enables to maintain at (or to bring to) a logic level (regeneration) the voltage levels present at the end of the previous transparent phase on output terminals OUTP and OUTM, whatever the voltage levels applied on input terminals INP, INM.

Taking the previous example (terminal OUTM in the low logic state and terminal OUTP in the high logic state), with a signal CLK at the low logic level and a signal CLKB at the complementary high logic level, transistor 28 turns on. The levels applied on the terminals of transistors $24_L$ and $24_R$ have no consequence on the logic state of the output terminals, transistor 27 being off. Current source 29 is still assumed to be conductive. Output terminal OUTP (high logic state) being connected to the control terminal of transistor $26_L$, this transistor turns on. Current source 29, through transistors 28 and $26_L$, maintains the junction point of the series assembly connected to output terminal OUTM in the low logic state. This low logic state is applied to the control terminal of transistor $26_R$, blocking the transistor and maintaining output terminal OUTP in the high logic state.

A bad synchronization of complementary signals CLK and CLKB can simultaneously turn on transistors 27 and 28. The logic states of output terminals OUTP and OUTM may be altered thereby. To overcome this phenomenon, a settling time must be respected to use the output signals of the latch. This delay adversely affects the switching speed of this latch.

Figure 2:
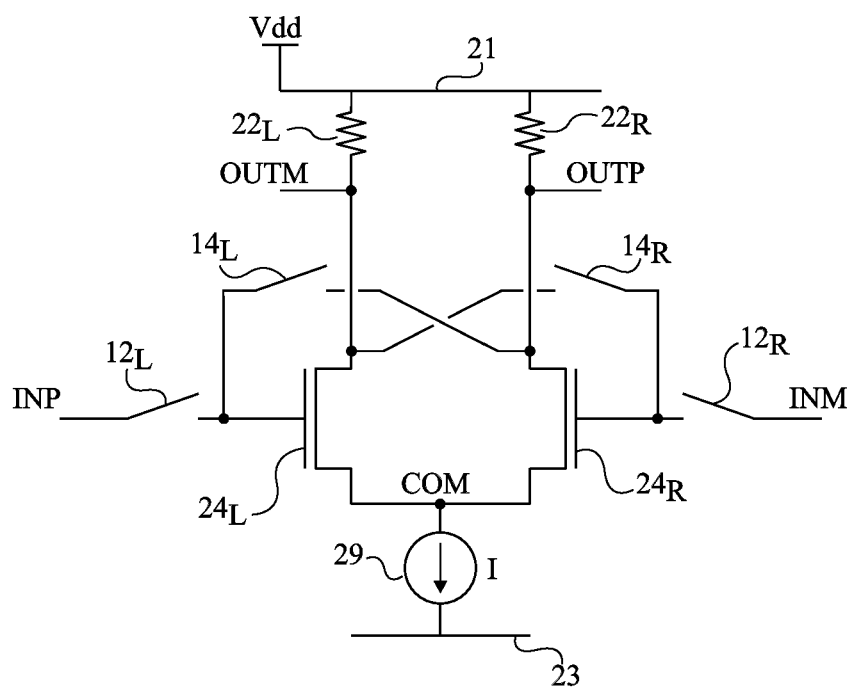
FIG. 2 shows a detailed electric diagram of a CML latch according to an embodiment of the present invention.

FIG. 2 shows an embodiment of a CML latch. The latch comprises an amplification and storage circuit comprising, in parallel between a terminal 21 of application of voltage Vdd and a current source 29 (I), two branches, each comprising two series-assembled components: a charge resistor 22 ($22_L$, $22_R$) and a transistor 24 ($24_L$, $24_R$) of an input stage. Output terminals OUTP and OUTM are defined by the junction points of the series assemblies. The conduction terminal (source or drain) of each transistor 24, opposite to resistor 22, is connected to current source 29. The other terminal of this current source is connected to ground 23.

An input terminal INP is connected to a conduction terminal of a switch $12_L$ (for example, a MOS transistor). The other conduction terminal of this switch is connected to the control terminal (gate) of transistor $24_L$. This control terminal is connected to a conduction terminal of a switch $14_L$. The other conduction terminal of this switch $14_L$ is connected to output terminal OUTP (of the other branch).

A similar switch structure is reproduced on the right branch side in the drawing. Input terminal INM is connected to a conduction terminal of a switch $12_R$. The other conduction terminal of this switch is connected to the control terminal of transistor $24_R$. This control terminal is connected to a conduction terminal of a switch $14_R$. The other conduction terminal of this switch $14_R$ is connected to output terminal OUTM.

Figure 3A:
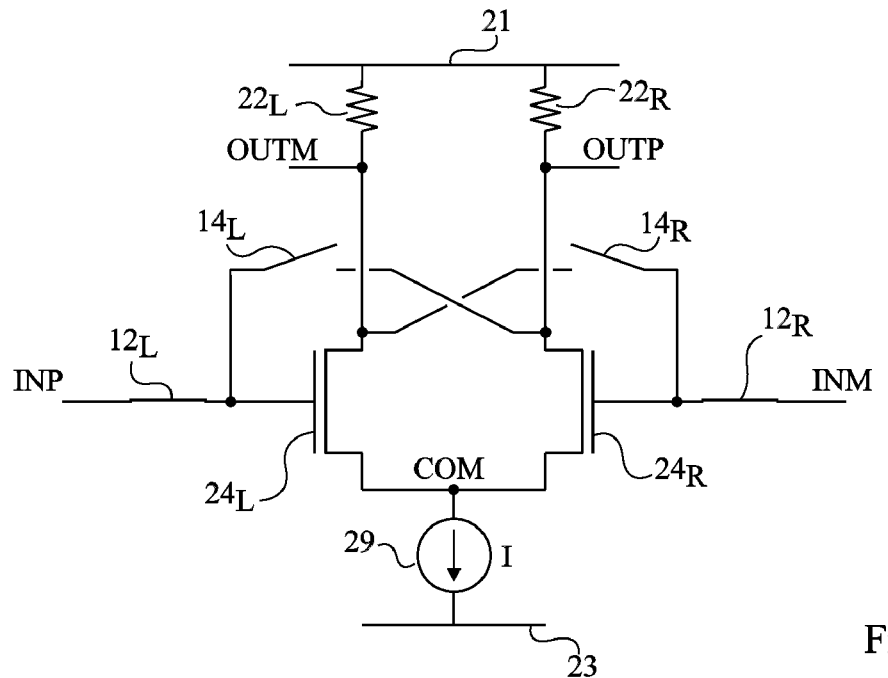
FIGS. 3A and 3B show, in the form of switches, the state of the transistors of a CML latch in transparent and storage phases according to an embodiment of the present invention.

FIG. 3A illustrates the operation of the circuit of FIG. 2 in transparent phase. In this phase, switches 12 ($12_L$, $12_R$) are on, switches 14 ($14_L$, $14_R$) are off, and current source 29 is active.

For example, a high logic level is assumed to be applied to input terminal INP and a low logic level is assumed to be applied to input terminal INM. Transistor $24_L$ is then on. Current source 29, through transistor $24_L$, draws output terminal OUTM to the low logic state. Conversely, transistor $24_R$ is off and the high logic level is maintained on output terminal OUTP.

Figure 3B:
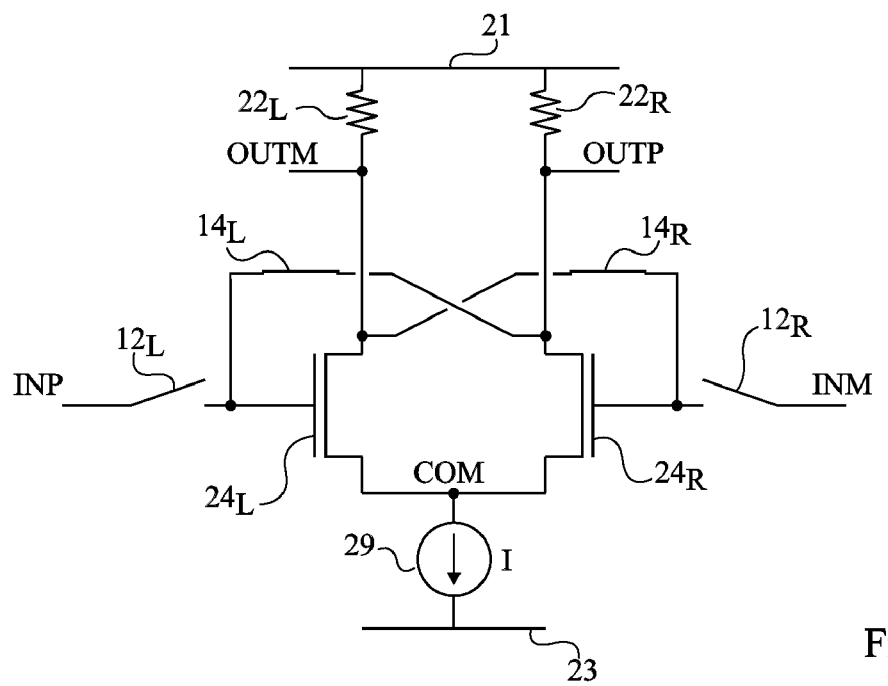

FIG. 3B describes the operation of the embodiment of FIG. 2 in the storage phase. In this phase, switches 12 ($12_L$, $12_R$) are controlled to be off and switches 14 ($14_L$, $14_R$) are controlled to be on. The high logic state, previously maintained on output terminal OUTP, is transmitted through switch $14_L$ to the gate of transistor $24_L$ and turns it on, thus maintaining output terminal OUTM in the low logic state. This low logic state is transmitted through switch $14_R$ to the gate of transistor $24_R$ and turns it off, thus maintaining output terminal OUTP in the high logic level. The levels applied on input terminals INP and INM have no consequence on the logic state of the output terminals.

The storage phase enables one to maintain at or to bring to a logic level (regeneration) the voltage levels present at the end of the previous transparent phase on output terminals OUTP and OUTM, whatever the voltage levels applied on input terminals INP, INM.

Figure 4:
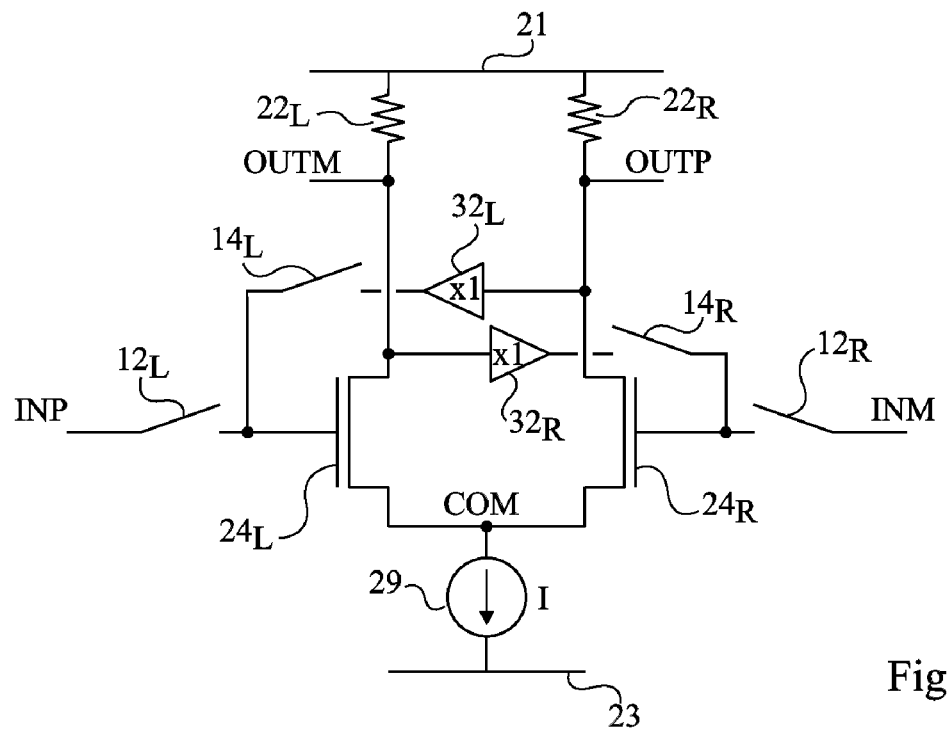
FIGS. 4, 5, and 6 show detailed electric diagrams of variations of CML latches according to an embodiment of the present invention.

FIG. 4 describes a variation of FIG. 2. A buffer amplifier $32_L$ (of unity gain) is inserted between output terminal OUTP and a conduction terminal of switch $14_L$. Another buffer amplifier $32_R$ is added between output terminal OUTM and a conduction terminal of switch $14_R$. Amplifiers 32 preferably have a unity gain. They reduce or eliminate the stray capacitances which may affect the control terminals of transistors 24.

In transparent phase, the operation of the assembly described in FIG. 4 is identical to the operation of the assembly described in FIG. 2. In the storage phase, switches 12 (12L, 12R) are controlled to be off and switches 14 (14L, 14R) are controlled to be on. The high logic state, previously maintained on output terminal OUTP, is transmitted by amplifier $32_L$ to the control terminal of transistor $24_L$ and turns it on, thus maintaining output terminal OUTM in the low logic state. With the same line of argument, the low logic state, previously maintained on output terminal OUTM, is transmitted through amplifier $32_R$ and turns off transistor $24_R$, maintaining output terminal OUTP in the high logic level.

Figure 5:
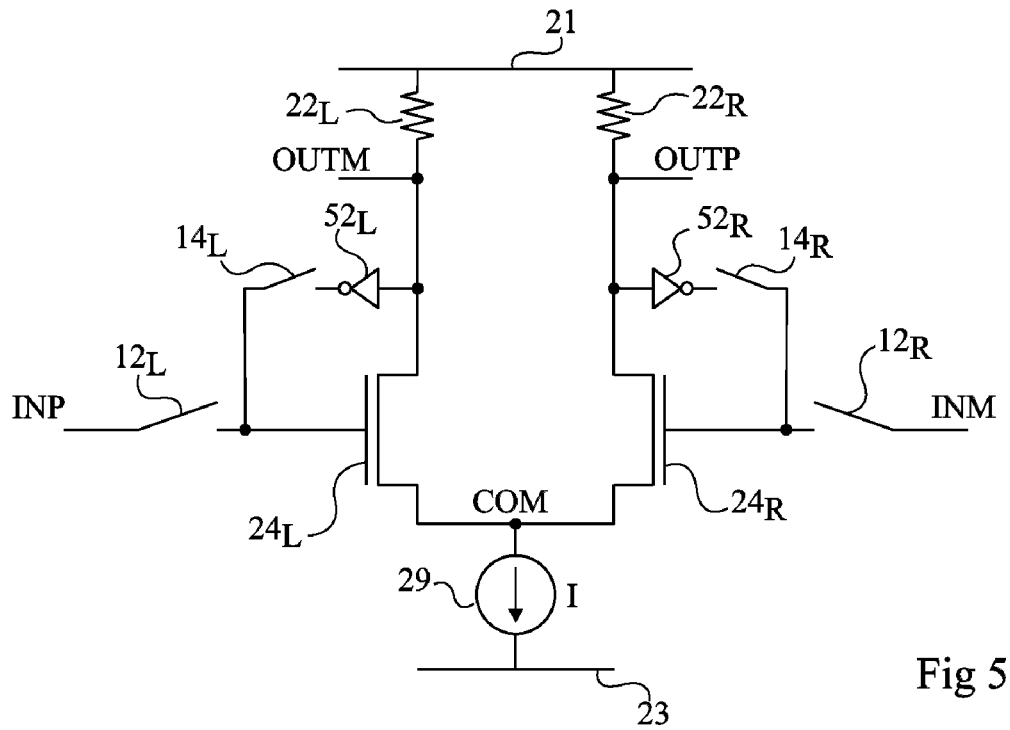

FIG. 5 describes another variation of FIG. 2. An inverter $52_L$ is added between output terminal OUTM and a conduction terminal of switch $14_L$. An inverter $52_R$ is added between output terminal OUTP and a conduction terminal of switch $14_R$. The position (upstream or downstream) of inverter 52 with respect to switch 14 may be inverted.

In transparent phase, the operation of the assembly described in FIG. 5 is identical to the operation of the assembly described in FIG. 2. In the storage phase, switches 12 ($12_L$, $12_R$) are controlled to be off and switches 14 ($14_L$, $14_R$) are controlled to be on. The high logic state, previously maintained on output terminal OUTP, is inverted by inverter $52_R$, and then transmitted by switch $14_R$, which turns off transistor $24_R$. Output terminal OUTP is maintained in the high logic level. With the same line of argument, the low logic state, previously maintained on output terminal OUTM, is inverted by inverter $52_L$, and then transmitted by switch $14_L$, which turns on transistor $24_L$, thus maintaining output terminal OUTM in the low logic state.

Figure 6:
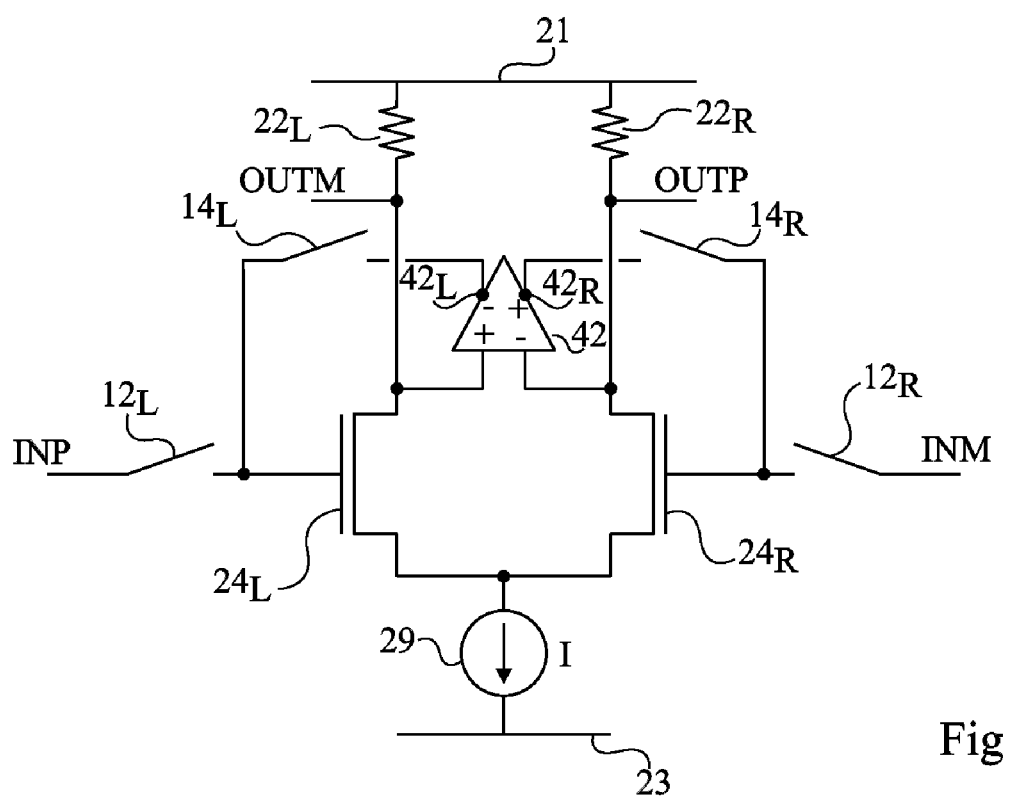

FIG. 6 describes another variation of FIG. 2, where a differential amplifier 42 is added. This differential amplifier amplifies the voltage difference between the values applied on its non-inverting (+) and inverting (−) input terminals by a given gain. The amplified voltage values will be centered on a voltage smaller than or equal to the amplifier power supply voltage.

Output terminal OUTP is connected to the input terminal, for example, inverting (−), of amplifier 42. Output terminal OUTM is connected to the other input terminal, for example, non-inverting (+), of amplifier 42. Output terminal $42_R$ (for example, non-inverting) of the amplifier is connected to a conduction terminal of switch $14_R$. The other output terminal $42_L$ (for example, inverting) of amplifier 42 is connected to a conduction terminal of switch $14_L$.

In transparent phase, the operation of the assembly described in FIG. 6 is identical to the operation of the assembly described in FIG. 2. In the storage phase, switches 12 ($12_L$, $12_R$) are controlled to be off and switches 14 ($14_L$, $14_R$) are controlled to be on. If a positive voltage difference is applied to the control terminals of transistors $24_R$ and $24_L$, this voltage difference is amplified by another differential amplifier formed of transistors $24_R$ and $24_L$, of resistors $22_R$ and $22_L$, and of current source 29. The voltage difference obtained between terminals OUTP and OUTM is then greater, in absolute value, than the voltage difference applied to the control terminals of transistors $24_R$ and $24_L$. At the output of differential amplifier 42, the voltage difference between terminals $42_L$ and $42_R$ is greater, in absolute value, than the voltage difference between terminals OUTP and OUTM. This new voltage difference is applied to the control terminals of transistors $24_R$ and $24_L$. This amplification loop carries on until one of outputs OUTP or OUTM reaches a power supply voltage level (neglecting the voltage drops internal to the circuit).

The variations of FIGS. 4, 5, and 6 enable one to further accelerate the switching of a CML latch by avoiding the current switching between a storage circuit and a distinct amplification circuit. Another advantage of these variations is that they enable one to reduce or eliminate stray capacitances between a control terminal and a voltage application terminal of a transistor 24. These embodiments may be extended to all the voltage levels applied to input terminals INM and INP.

Specific embodiments of the present invention have been described. Various alterations, modifications and improvements will occur to those skilled in the art. In particular, although the present invention has been described in relation with an example of a latch formed of CMOS transistors, of resistors, and of current sources, the present invention is applicable to other transistor technologies, for example, bipolar transistors, or to other arrangements of components. For example, the current sources may be resistors or assemblies based on transistors, the transistors may have an N or P channel, the control signals being accordingly adapted. Further, although the present invention has been described with a vocabulary relative to digital signals, the described circuit also operates with analog input signals. Finally, for simplification, the control signals of switches 12 and 14 have not been illustrated, and their generation is within the abilities of those skilled in the art based on the above functional description. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A common-source circuit comprising two branches in parallel between a terminal of application of a voltage and a current source, each branch comprising:
   a series association of a resistor and a transistor, having their junction point defining an output terminal of the branch;
   a first switch connecting an input terminal of the branch to a control terminal of the transistor; and
   a second switch having a terminal connected to a control terminal of the transistor, the switch maintaining or regenerating a logical signal present at the input terminal of the respective branch.

2. The device of claim 1, wherein the second switch is connected between the control terminal of the respective transistor and the output terminal of the opposite branch.

3. The device of claim 1, wherein the second switch is connected between the control terminal of the respective transistor and a buffer amplifier, an input terminal of the buffer amplifier being connected to the output terminal of the opposite branch.

4. The device of claim 1, wherein the second switch is connected between the control terminal of the respective transistor and an inverter, an input terminal of the inverter being connected to the output terminal of the respective branch.

5. The device of claim 1, wherein the second switch is connected between the control terminal of the respective transistor and a differential amplifier, a first input terminal of the differential amplifier being connected to a first one of the output terminals and a second input terminal of the differential amplifier being connected to a second one of the output terminals, the output terminals of the differential amplifier being connected to the respective terminals of the second switches.

6. The device of claim 1, wherein the first and second switches are configured to avoid a simultaneous conduction of the two branches.

7. The device of claim 1, wherein the transistors are MOS-type transistors.

8. The device of claim 1, wherein the transistors are bipolar transistors.

9. A method for controlling a logic circuit comprising:
   in a first phase, connecting a first input signal to a first control terminal of a first branch, the first branch including a first resistive element and a first transistor series-connected between a power supply voltage and a current source and connecting a second input signal to a second control terminal of a second branch, the second branch including a second resistive element and a second transistor series-connected between the power supply voltage and the current source; and in a second phase, disconnecting the first input signal from the first control terminal, disconnecting the second input signal from the second control terminal and connecting, connecting a first output terminal of the first branch to the control terminal of the second branch and connecting a second output terminal of the second branch to the control terminal of the first branch.

10. The method of claim 9 further comprising, in the second phase, amplifying an output signal from the output terminal of the first branch prior to applying same to the control terminal of the second branch, and amplifying an output signal from the output terminal of the branch prior to applying same to the control terminal of the first branch.

11. The method of claim 10, wherein the amplifying step has a unity gain.

12. The method of claim 9, wherein in the first phase, a first output signal on the first output terminal of the first branch tracks the first input signal and a second output signal on the second output terminal of the second branch tracks the second input signal, and wherein in the second phase, the first output signal is maintained regardless of the first input signal and the second output signal is maintained regardless of the second input signal.

13. The method of claim 9, wherein the steps of connecting are accomplished by transitioning a switch to a conductive state.

14. The method of claim 13, wherein transitioning a switch to a conductive state is accomplished by transitioning a transistor to a conductive state.

15. The method of claim 9 further comprising applying to a differential amplifier the difference in voltage between the first control terminal and the second control terminal, applying the inverting output of the differential amplifier to the first output terminal of the first branch and applying the non-inverting output of the differential amplifier to the second output terminal of the second branch, during the second phase.

16. A circuit comprising:
a first branch including a first resistor coupled between a voltage rail and a drain of a first transistor, the source of the first transistor being coupled to a current source;
a first switch operable to selectively couple a gate of the first transistor to an input source;
a second branch including a second resistor coupled between the voltage rail and a drain of a second transistor, the source of the second transistor being coupled to the current source;
a second switch operable to selectively couple a gate of the second transistor to a second input source;
a third switch operable to selectively couple a first common node between the first resistor and the first transistor to the gate of the second transistor; and
a fourth switch operable to selectively couple a second common node between the second resistor and the second transistor to the gate of the first transistor.

17. The circuit of claim 16, wherein at least one of the first, second, third, and fourth switches is a transistor.

18. The circuit of claim 16 further including a differential amplifier and wherein the first common node is coupled to the gate of the second transistor via a non-inverting input and a non-inverting output of the differential amplifier and the second common node is coupled to the gate of the first transistor via an inverting input and an inverting output of the differential amplifier.

19. The circuit of claim 16 further including a first inverter in series with the third switch and a second inverter in series with the fourth switch.

20. The circuit of claim 19, wherein the first inverter is connected between the third switch and the gate of the second transistor and the second inverter is connected between the fourth switch and the gate of the first transistor.

\* \* \* \* \*

UNITED STATES PATENT AND TRADEMARK OFFICE
CERTIFICATE OF CORRECTION

PATENT NO.       : 8,378,727 B2
APPLICATION NO.  : 13/166608
DATED            : February 19, 2013
INVENTOR(S)      : Singh et al.

It is certified that error appears in the above-identified patent and that said Letters Patent is hereby corrected as shown below:

In the Claims:

In Col. 7, line 15, claim 10, before "branch" insert --second--.

Signed and Sealed this
Fourth Day of June, 2013

Teresa Stanek Rea
*Acting Director of the United States Patent and Trademark Office*